US006563153B2

(12) United States Patent
Wikborg et al.

(10) Patent No.: US 6,563,153 B2
(45) Date of Patent: May 13, 2003

(54) ELECTRICALLY TUNABLE DEVICE AND A METHOD RELATING THERETO

(75) Inventors: Erland Wikborg, Danderyd (SE); Zdravko Ivanov, Göteborg (SE); Peter Petrov, Göteborg (SE); Spartak Gevorgian, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/885,520

(22) Filed: Jun. 20, 2001

(65) Prior Publication Data

US 2001/0054748 A1 Dec. 27, 2001

(30) Foreign Application Priority Data

Jun. 20, 2000 (SE) ................................................ 0002296

(51) Int. Cl.[7] ......................... H01L 29/76; H01L 29/94; H01L 31/062; H01L 31/113; H01L 31/119
(52) U.S. Cl. ...................... 257/295; 257/296; 257/303; 257/306; 257/310
(58) Field of Search ................................. 257/295–310

(56) References Cited

U.S. PATENT DOCUMENTS

| 5,472,935 | A |   | 12/1995 | Yandrofski et al. |
| 5,640,042 | A |   | 6/1997  | Koscica et al. |
| 5,688,724 | A | * | 11/1997 | Yoon et al. ............... 437/235 |
| 5,743,225 | A |   | 4/1998  | Sakurai |
| 5,977,577 | A |   | 11/1999 | Evans, Jr. |
| 6,151,240 | A | * | 11/2000 | Suzuki ..................... 365/145 |
| 6,350,644 | B1 | * | 2/2002  | Sakurai ..................... 438/240 |

* cited by examiner

Primary Examiner—Eddie Lee
Assistant Examiner—Jesse A. Fenty
(74) Attorney, Agent, or Firm—Burns, Doane, Swecker & Mathis, L.L.P.

(57) ABSTRACT

A thin film ferroelectric varactor device comprising a substrate layer, a ferroelectric layer structure and an electrode structure is presented. The ferroelectric layer structure comprises a number of ferroelectric layers and a number of intermediate buffer layers arranged in an alternating manner. At least a first and a second layer of the ferroelectric layers have different Curie temperatures, i.e. the dielectric constant of the first ferroelectric layer has a maximum at a temperature which is different from the temperature at which the dielectric constant of the second ferroelectric layer has a maximum.

18 Claims, 7 Drawing Sheets

ELECTRICALLY TUNABLE DEVICE AND A METHOD RELATING THERETO

This application claims priority under 35 U.S.C. §§119 and/or 365 to 0002296-2 filed in Sweden on Jun. 20, 2000; the entire content of which is hereby incorporated by reference.

BACKGROUND

The present invention relates to the field of electrically tunable devices e.g. for microwave (radio frequency) circuits. Particularly it relates to a thin film ferroelectric varactor device, use of such a device in microwave (or millimeter wave) circuits and to a method of producing such a device.

Various tunable devices for use in microwave and millimeter wave devices have been proposed in the past. A varactor is a variable capacitance device in which the capacitance depends on a voltage applied thereto. Varactors are known to be used in RF tuning applications among others due to the fact that the capacitance variations of the varactor caused by an applied voltage has corresponding effects on frequency tuning.

Varactors based on semiconductors are known. However, such devices are disadvantageous in many aspects. They suffer e.g. from a low tunability (low dynamic range) at microwave frequencies, i.e. above 10–20 GHz, and the microwave losses are also high. Due to the inherent properties of semiconductor materials such varactors are susceptible to overheating and burnout if forward biased or reverse biased with an excessive applied voltage. Semicondutor PN junction devices have a depletion region which is subjected to high electric field stress, and as a consequence thereof, such devices may break down as the applied voltage is varied. Still further, semiconductor materials have dielectric constants between about 10–15, i.e. low dielectric constants which limits the capacitance and this is very disadvantageous for a plurality of applications.

Microelectromechanical varactors are also known. As opposed to semiconductor varactors they have a high dynamic range, or a high tunability and low microwave losses but the tuning speed is limited to tens of microseconds. In addition thereto they are sensitive to mechanical vibrations, they have a short lifetime and they are also not reliable.

Varactors based on ferroelectric materials or non-linear dielectrics are also known, e.g. from U.S. Pat. No. 5,472,935. The main disadvantage of the varactors disclosed in the above mentioned document, as well as other tunable microwave devices based on (bulk) ferroelectrics, is that the parameters are extremely temperature dependent which is related to the inherent temperature dependence of the ferroelectric materials. This is illustrated in FIG. 1A, FIG. 1B which show the extreme temperature dependence close to the maximum of the dielectric constant of typcial ferroelectric materials, Barium Titanate ($BaTiO_3$, BTO) and Strontium Titanate ($SrTiO_3$, STO). The dependence of the dielectric constant on an applied electrical DC field (the tunability) is also stronger close to the maximum of the dielectric constant whereas away from the maximum of the dielectric constant, the tunability is low. STO for example is not tunable at room temperature at a reasonably low applied electric field (E<100 kV/cm). This means that capacitors based on STO are not tunable at about room temperature (i.e. they are actually no varactors). This means that a high temperature stability only can be achieved in combination with a low tunability.

In addition thereto a transition layer is formed in the surface of the ferroelectric material at the interface between the electrodes of metal, e.g. gold, and the ferroelectric material in the varactor. The internal electric field of this layer will reduce the dielectric constant of the ferroelectric material and as a consequence thereof it also reduces the sensitivity to the applied external DC fields. In other words, the tunability of the varactor is reduced.

Ferroelectric varactors based on bulk material suffer among others from the drawback that the thickness of such devices limits the total capacitive effect.

It has been found advantageous to use thin ferroelectric films for the production of tunable capacitors since the dielectric constant of the ferroelectric films is tunable by variation of a voltage applied to the film. At high frequencies such films intrinsically show comparatively low losses.

U.S. Pat, No. 5,640,042 shows a simple ferroelectric varactor comprising a plurality of thin film layers. A carrier substrate layer is provided on which a metallic conductive layer is deposited. The thin film ferroelectric is in turn deposited on the metallic conductive layer and a plurality of longitudinally spaced metallic conductive means are disposed on the thin film ferroelectric. The carrier substrate layer, the metallic conductive layer and the thin film ferroelectric layer may have matching lattices to form a matched crystal structure. However, even if higher capacitance values than for example in semiconductor varactors can be obtained resulting in a higher tunability, such devices do not work satisfactorily for a plurality of implementations, e.g. because the temperature stability is not good enough and the extent to which such a device can be tuned is not sufficient.

SUMMARY

What is needed is therefore an improved varactor device. More particularly a varactor device is needed which has a high dynamic range (a large range of tunability) and at the same time shows a high temperature independence, i.e. which shows a high degree of temperature stability. Particularly a ferroelectric varactor device is needed which is reliable, has a long lifetime and which do not suffer from mechanical stresses or vibrations or similar. Still further a varactor device is needed for which the tuning speed is high. The tuning speed can be defined as dC/dt, i.e. the time (t) derivative of the capacitance (C) and shows how fast the capacitance can be tuned. Further a ferroelectric varactor device is needed which is easy to fabricate and which moreover is not expensive to fabricate. Further yet a varactor device is needed which is suitable for a large number of applications, particularly for microwave or millimeter wave applications or even more particularly for microwave radio frequency applications. Particularly a varactor device is needed which has a high tunability (high dynamic range) and which is temperature independent in a given temperature interval.

A method of producing such a varactor device, fulfilling one or more of the above mentioned objects, is also needed which method particularly is easy to implement. A method of operating a tunable ferroelectric varactor device as referred to above is also needed.

Therefore a thin film ferroelectric varactor device comprising a substrate layer, a ferroelectric layer structure and an electrode structure is provided wherein the ferroelectric layer structure comprises a number of ferroelectric layers and a number of intermediate buffer layers arranged in an alternating manner. At least a first and a second of said ferroelectric layers, between which an intermediate buffer layer, which may be dielectric, is arranged, have different Curie temperatures. The Curie temperature is specifically defined as a temperature characterizing the temperature dependence of the dielectric constant. Specifically it is the temperature for which the dielectric constant has a maximum. According to the invention, different Curie temperatures for the respective ferroelectric layers is provided through giving ferroelectric layers a different chemical composition, or by chemically isolating the ferroelectric layers from one another, such that different Curie temperatures are provided. The content of at least one element of the elemental composition of the respective layer is different in the at least two layers. (Specially the content of an element may be zero in one of the layers.)

Advantageously at least some of the layers of the varactor device have lattice matched crystal structures. Even more particularly all layers, i.e. the layers of the ferroelectric layer structure, the electrode structure and the substrate layer, have lattice matched crystal structures.

In a preferred implementation the layers, particularly the intermediate buffer layers and the ferroelectric layers and the substrate layer comprise single crystalline films (epitaxial films).

In a preferred implementation the ferroelectric layers comprise a ceramic material. Particularly at least one element or component of the ceramic material is provided in a different fraction for a number of the layers or particularly for all layers, such that at least adjacent ferroelectric layers, wherein adjacent is taken to mean that ferroelectric layers between which an intermediate buffer layer, particularly a dielectric buffer layer, is provided, contain different fractions of said element(s).

In an advantageous implementation the ceramic materials comprise perovskite oxides or solid solutions thereof, $ABCO_3$, wherein A for example is one of Ba, Na; B is anyone of e.g. Sr, Kr; C is one of Tc, Nb etc. In a particular implementation the ferroelectric layers comprise $Ba_xSr_{1-x}TiO_3$. At least for the above mentioned first and second layers the Barium (Ba) content is different, thus for a first and a second layer the elemental composition is $Ba_{x1}Sr_{1-x1}TiO_3$ and $Ba_{x2}Sr_{1-x2}TiO_3$ respectively resulting in different Curie temperatures. Of course there may be more than two layers having different xi values or specifically different Barium-content. Particularly is for each ferroelectric layer i, $0 \leq xi \leq 1$.

In an alternative implementation the at least two layers comprise $Na_{xi}K_{1-xi}NbO_3$ wherein xi is different for, at least two "adjacent" ferroelectric layers. In a particularly advantageous implementation the intermediate buffer layers comprise dielectric films. The dielectric films between different ferroelectric layers may have the same elemental composition or different elemental compositions.

In a particular implementation, at least one of the dielectric films has an elemental composition of MgO, $LaAlO_3$, $CeO_2$ or a material with similar properties. If the ferroelectric structure is such that there are more than one intermediate buffer layer, e.g. if there are more than two ferroelectric layers requiring an intermediate buffer layer between them, or, if an intermediate layer also is provided between a ferroelectric layer and the substrate layer, each dielectric buffer layer may be of the same elemental composition but it does not have to. In a particularly advantageous implementation at least one of the dielectric intermediate buffer layers has an elemental composition of $WO_3$.

According to different implementations one dielectric layer has an elemental composition of $WO_3$ whereas one or more other layers comprise MgO or similar; alternatively all of the layers comprise $WO_3$. In still another implementation, at least one of the intermediate buffer layers comprises a multilayer structure comprising a number of sublayers, with at least one sublayer with an elemental composition of MgO or similar, as referred to above, and at least one sublayer with an elemental composition of $WO_3$. The substrate layer may have an elemental composition of MgO, $LaAlO_3$ or a material with similar properties whereas the electrode structure may comprise longitudinally arranged electrodes defining a gap between them. The electrodes may for example comprise gold (Au), copper (Cu), silver (Ag) or similar but they may also comprise superconductors or particularly high temperature superconductors, of YBCO (YBaCuO) or TBCCO (TlBaCaCuO).

In a preferred implementation the ferroelectric layers have a thickness smaller than, or equal to, 1 µm. The intermediate buffer layers, which particularly are dielectric, may have a thickness of 100 nm or less. They may be also be somewhat thicker in case they consist of a combination of $WO_3$ and MgO (also than they may however be as thin as referred to above) or similar, or if they comprise a multilayer structure. In another implementation, the ferroelectric layer structure comprises a ferroelectric nanostructure with ultra thin ferroelectric layers having a thickness substantially smaller than or equal to 100 nm. A buffer layer may be provided adjacent to the electrode structure, i.e. between the electrodes and a ferroelectric layer or an intermediate buffer layer (a dielectric layer). Such buffer layer may for example consist of thin metallic Mg films.

The ferroelectric device may particularly comprise a ferroelectric layer structure comprising three or more ferroelectric layers wherein between each pair of ferroelectric layers a preferably dielectric, intermediate buffer layer is provided. An intermediate buffer layer may also be provided between the substrate layer and the ferroelectric layer to be deposited on the substrate layer.

Particularly the temperature dependence of the capacitance of the varactor can be controlled by selection of the Curie temperatures/the xi values in the elemental compositions of the respective ferroelectric layers, i.e. the content of at least one element of the elemental composition.

A thin film ferroelectric varactor device comprising a substrate layer, a ferroelectric layer structure and an electrode structure is provided in which the ferroelectric layer structure comprises a number of ferroelectric layers and a number of intermediate buffer layers, which preferably are dielectric, wherein the ferroelectric layers and the dielectric layers are arranged in an alternating manner such that ferroelectric layers between which an intermediate buffer layer is provided, are chemically separated from each other. At least some of the ferroelectric layers have a different elemental composition. Particularly the ferroelectric layers comprise ceramic materials, such as perovskite oxides or solid solutions of the type $A_{xi}B_{1-xi}CO_3$ wherein xi is different for at least some subsequent ferroelectric layers between which an intermediate buffer layer is provided. Particularly, for each layer i, $0 \leq xi \leq 1$. Particularly the ferroelectric layers i, wherein i, . . . , N; N being the number of ferroelectric layers of the structure, comprise $Ba_{xi}Sr_{1-xi}TiO_3$ or $Na_{xi}K_{1-xi}NbO_3$. Particularly all layers of the varactor device have matching crystal structures and the Curie temperatures of the respective ferroelectric layers are different, wherein the respective Curie temperatures are given by the selection of each xi, and the selection is done so as to assure that the maximum values of the dielectric constants of the respective layers are different. Particularly the temperature dependence of the capacitance of the varactor can be controlled. Particularly the Ba-content/the Na-content is different for each respective layer (having as a consequence that also the Sr/K content is different).

According to the invention the varactor devices as discussed above may with advantage be used in microwave (radio frequency) circuits, such as tunable resonators, filters, phase shifters, delay lines, mixers, harmonic generators or similar.

A method of producing a thin film ferroelectric varactor device comprising a substrate layer structure, a ferroelectric layer structure and an electrode structure is also given which includes the steps of; providing a ferroelectric layer structure on the substrate layer structure, including the steps of; providing an intermediate, preferably dielectric, buffer layer between each of a number of ferroelectric layers; for at least two ferroelectric layers (i;i+1), selecting different contents (xi,x(i+1)) of a first component of the elemental compositions of the layers; selecting the contents (xi,x(i+1)) such that the dielectric constants of different layers will have different Curie temperatures. The varactor may then be operated between the Curie emperatures of the two ferroelectric layers.

BRIEF DESCRIPTION OF THE DRAWINGS

The invention will in the following be further described in a non-limiting manner and with reference to the accompanying drawings in which.

DETAILED DESCRIPTION

Figure 1A:
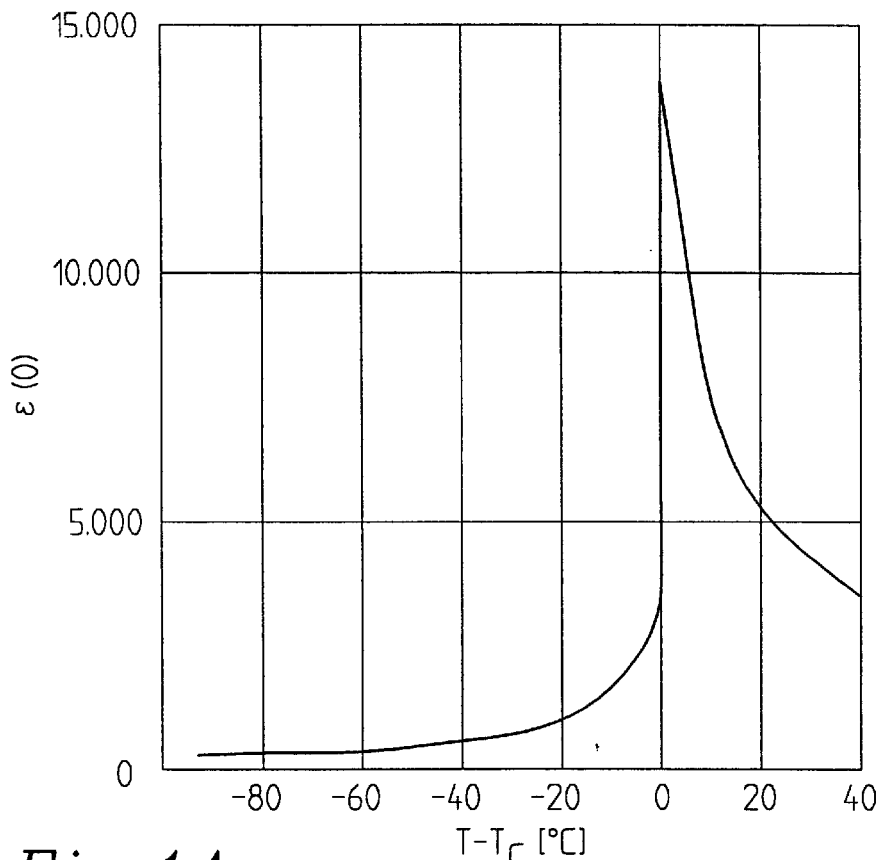
FIG. 1A is a plot of the temperature dependence of BTO.
Figure 1B:
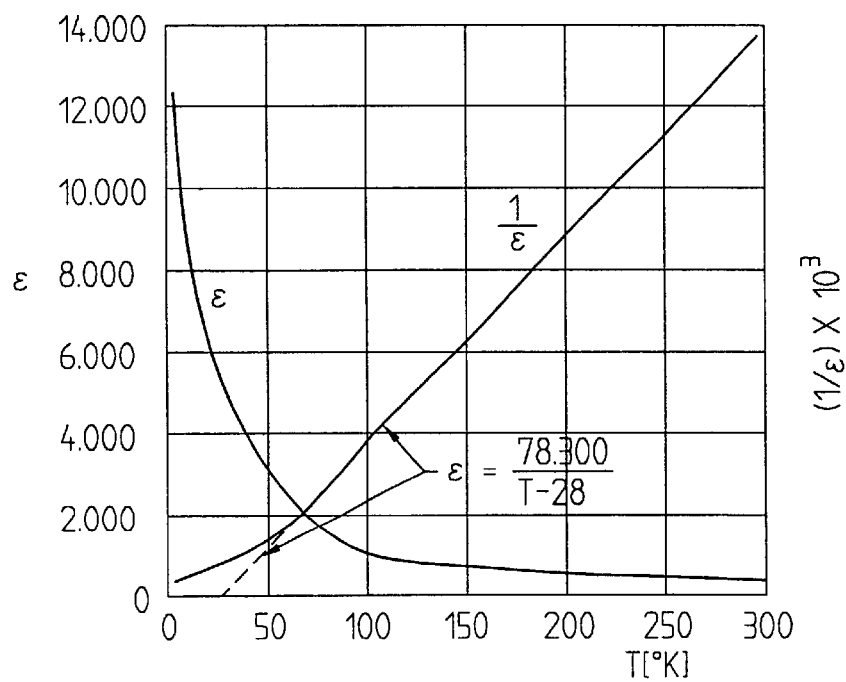
FIG. 1B is a plot of the temperature dependence of STO.

FIGS. 1A and 1B respectively show the extreme temperature dependencies close to the maximum of the dielectric constant for Strontium Titanate ($SrTiO_3$; STO) (FIG. 1B) and Barium Titanate ($BaTiO_3$; BTO) (FIG. 1A) respectively. The dielectric constant shows a dependence on applied DC field which is stronger close to the maximum of the dielectric constant whereas further away from the maximum in the dielectric constant it decreases. This means that the tunability should be high where the dielectric constant has a maximum whereas further away from the maximum, the tunability is low. As referred to earlier, STO is not tunable at room temperature at reasonably low applied electric fields. FIG. 1B illustrates the dependence of the dielectric constant (the inverse of the dielectric constant) on temperature above the Curie temperature $T_{CR}$, i.e. $T > T_{CR}$. This dependence is given by Curie-Weiss law; $\epsilon = 78.300/(T-T_{CR})$. For $SrTiO_3$ $T_{CR} = 28$ [°K]. For $T_{CR} = 381K$.

The Curie temperature is defined as a temperature characterizing the temperature dependence of the dielectric constant. (FIG. 1B shows $\epsilon = 78.300/(T-T_{CR})$, wherein $T_{CR} = 28K$, for STO.) $T_{CR}$, or rather the temperature where dielectric constant has its maximum, may be controlled by pressure in a limited temperature interval.

The most efficient wave of tuning $T_{CR}$ in a wide temperature range is according to the invention done by changing the content of one component in a material comprising a ceramic composition such as $ABCO_3$, e.g. the content of Ba,Na or any other appropriate material.

According to the invention ferroelectric varactors are disclosed which have a high tunability or a high dynamic range which means a large range of tunability. The tunability is defined as $T(V) = [C(0) - C(V)]/C(O)$, wherein V is the voltage applied to the varactor DC field, $C(O)$ is the capacitance of the varactor at $V=0$, whereas the $C(V)$ is the capacitance of the varactor at $V = V_{max}$ which is the maximum applied voltage.

The varactors according to the invention show a high tunability and are substantially temperature independent in a given temperature interval (between the Curie temperatures of the dielectric constants of the respective ferroelectric layers).

Figure 2:
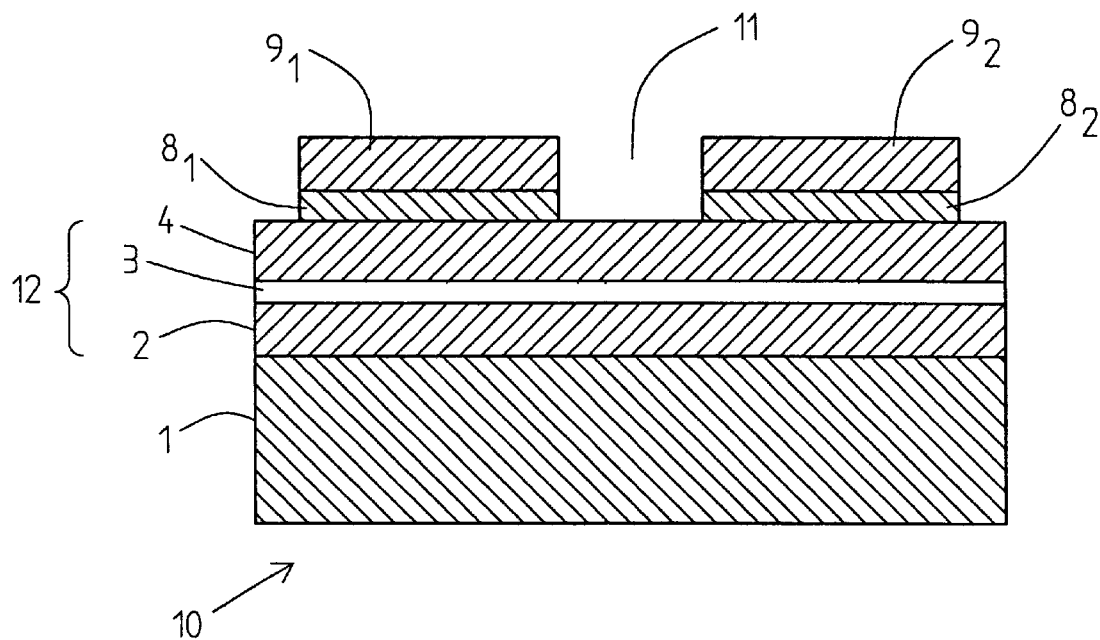
FIG. 2 is a cross-sectional view of a varactor device according to a first embodiment of the present invention.

In FIG. 2 a varactor device 10 according to a first embodiment is illustrated. It includes a substrate layer 1 which comprises a low microwave loss, crystalline dielectricum of for example MgO, $LaAlO_3$ or a similar material, i.e. a material with similar properties. On the substrate layer 1 the ferroelectric layer structure 12 is deposited which here comprises a first ferroelectric layer 2, an intermediate buffer layer 3, which preferably is dielectric, and a second ferroelectric layer 4.

The first ferroelectric layer 2 is deposited on substrate layer 1. The ferroelectric layers 2,4 comprises ceramic materials, e.g. perovskite type oxides or a solution thereof of the type $A_xB_{1-x}CO_3$ wherein A=Ba,Na etc. B=Sr,K etc. C=Ti, Nb or similar. Any such material can in principle be used as long as the microwave losses are low. In particular embodiments the ceramic materials comprise $Ba_{xi}Sr_{1-xi}TO_3$ or $Na_{xi}K_{1-xi}NbO_3$, wherein xi is selected to be different for the respective layers 2, 4 such that different Curie temperatures are obtained. xi is such that $0 \leq xi \leq 1$. This means particularly, that for $Ba_xSr_{1-x}TiO_3$ there will be two extreme cases, namely when xi=0 it will be $SrTiO_3$ whereas for x=1 it will be $BaTiO_3$. In case of $Na_{xi}K_{1-xi}NbO_3$ there will also be two extreme cases, namely for xi=0, it will be $KNbO_3$ whereas for xi=1, it will be $NaNbO_3$. In general, xi may take any value between 0 and 1, including 0 and 1.

In this embodiment it is supposed that the first ferroelectric layer 2 comprises $Ba_{x1}Sr_{1-x1}TiO_3$, wherein xi has a selected value x1 and this layer is deposited on the substrate layer 1. A dielectric film layer 3, e.g. of MgO, LaAlO$_3$, CeO$_2$ or similar is deposited on the ferroelectric layer. On the dielectric layer 3 a second ferroelectric layer 4 is deposited which comprises another ferroelectric film, for example Ba$_{x2}$Sr$_{1-x2}$TiO$_3$, wherein x2 is selected to have a value different from that of x1. The substrate layer 1 and the layers of the ferroelectric structure, i.e. layers 2, 3, 4, have matching crystal structures among others to prevent mechanical stresses in the films. Matching crystal structures here means that the two interfacing crystals (substrate-ferroelectric layer, ferroelectric layer-dielectric layer or substrate-dielectric layer) should have crystalline structures and lattice constants which are as close to each other as possible.

In the varactor device 10 of FIG. 2 the Curie values of the ferroelelctric Barium-Strontium-Titanate (BSTO) films are controlled by means of the Barium-content, i.e. by the xi factors x1 and x2 as discussed above. The two ferroelectric layers with different Barium-content are chemically isolated from each other through the presence of the dielectric layer 3. In a most advantageous implementation (relevant to the embodiment of FIG. 2 and all other embodiments to be described below), all layers are epitaxial, i.e. single crystalline to ensure a high dielectric constant, a high tunability and low microwave losses. The intermediate buffer layer 3, which preferably is a dielectric film, particularly is used to ensure a chemical isolation of the two BSTO-films with different xi-values, i.e. to prevent the formation of a new phase of BSTO with an x-value between x1 and x2, and hence with a different Curie value (maximum of the dielectric constant), c.f. the two peaks in dielectric constants for xi and x2 respectively as in FIG. 3. In other words the dielectric film layer 3 serves the purpose of ensuring distinctly different properties and locations of the (temperature) peaks in dielectric constants of the first ferroelectric layer 2 and the second ferroelectric layer 4. Preferably, as referred to above the xi-values are between 0 and 1. The intermediate buffer layer 3 also is used to ensure a high crystalline quality of the ferroelectric layer 4. Ferroelectric layers usually have a good crystalline quality if the thickness of the film layer is small, particularly less than 1 µm. Attempts to grow thicker epitaxial films lead to degradation of the crystalline structure (due to generated defects) and of the dielectric properties. Application of thin, usually less than 100 nm, intermediate buffer layers of lattice matched dielectric layers, of for example MgO, LaAlO$_3$, CeO$_2$ or similar, as referred to above, helps restoring the crystalline structure of the ferroelectric layer 4 of the ferroelectric structure. Since the thickness of the intermediate (dielectric) buffer layer 3 is small, in practice it does not particularly affect the capacitance and the tunability of the varactor.

As will be discussed further below, instead of using an epitaxial three-layer ferroelectric structure as shown in the embodiment of FIG. 2, it is possible to make varactors comprising a multi-layer ferroelectric structure, for example with ferroelectric layers of BSTO and a dielectric of MgO, with a lower capacitance (which sometimes may be wanted) and lower microwave losses at the expense of a lower tunability. Also other multilayer structures are possible of which some will be disclosed below.

Figure 3:
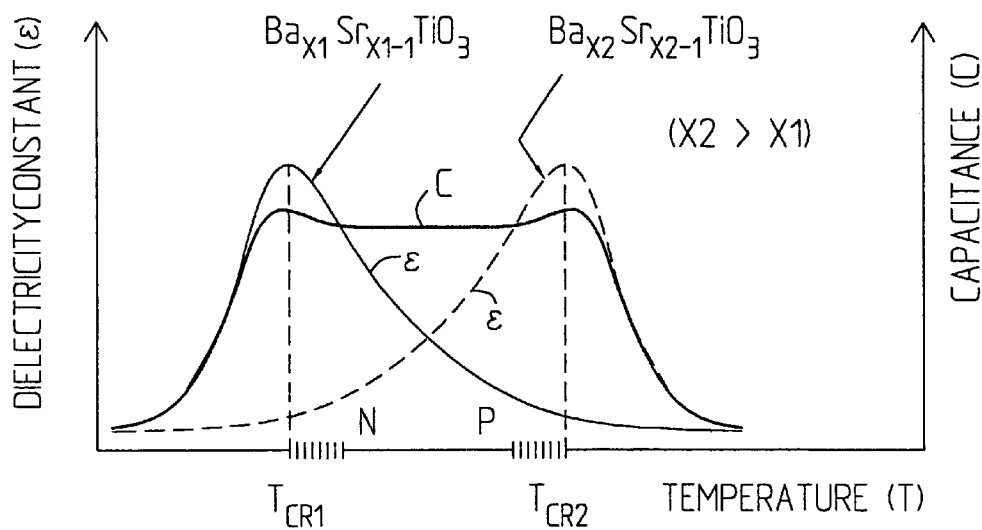
FIG. 3 is a plot illustrating how a substantially temperature independent capacitance can be obtained by controlling the content of Ba for two ferroelectric layers comprising BSTO.

The ferroelectric layer 2 and ferroelectric layer 4 have different barium (Ba) contents and hence different Curie temperatures T$_{CR1}$ and T$_{CR2}$ respectively as illustrated in FIG. 3. The maximums of the dielectric constants occur for different temperatures. The Curie temperatures of the ferroelectric layers 2 and 4 (i.e. the locations of the maximums of the dielectric constants) are chosen by properly selecting the Ba-content in the layers 2, 4, i.e. the xi-values.

This selection is properly made so that the desired operational temperature range of the varactor is between the Curie temperatures of ferroelectric layers 2 and 4, c.f. FIG. 2. The capacitance measured between the two electrodes 9$_1$, 9$_2$ will then have a nearly temperature-independent value as can be seen from FIG. 3. The tunability of such a varactor will, because of the overlapping "tails" of the dielectric constants of the layers 2 and 4, be larger than for a varactor based only on for example layer 2 or layer 4 in the same temperature range.

In addition thereto, through a proper Ba-doping of the ferroelectric layers, i.e. by proper choice of the x-values, it is possible to choose the sign of the temperature coefficient of the capacitance (TCC) in a given temperature range. The temperature coefficient of the capacitance is given as TCC=[C(T1)−C(T2)]/C(T1);C(T1) and C(T2) being the capacitances at T1 and T2 respectively. In FIG. 3 TCC is negative in the range from T$_{CR1}$ to N, positive in the range between P to T$_{CR2}$, and approximately zero between N and P.

Particularly, a ferroelectric-dielectric multilayer structure may comprise several layers of ferroelectric material with different xi:s, i.e. different contents of e.g. the A-component, for example Ba or Na, and different Curie temperatures. This provides a mean to, even more accurately, tailor the temperature dependence of the capacitance of the varactor.

In one embodiment, not shown, the ferroelectric structure comprises a multilayer structure comprising a ferroelectric nanostructure comprising a periodic stack in the form of ultra-thin ferroelectric layers which have a thickness of less than 100 nm and dielectric layers arranged in an alternating manner. A multilayer structure may e.g. have more than two layers with a total thickness of about 0.5 µm. Such structures exhibit enhanced non-linear properties and high electric fields and hence a high tunability may be achieved at the application of also low voltages.

In the embodiment illustrated in FIG. 2 buffer layers 8$_1$, 8$_2$ are provided between the electrodes 9$_1$, 9$_2$ and the ferroelectric film. They serve the purpose of eliminating interfacial transition layers as discussed earlier in the application. The buffer layers 8$_1$, 8$_2$ may e.g. comprise metallic magnesium. In a particular implementation the electrodes 9$_1$, 9$_2$, consists of gold electrodes. Through the use of the buffer layers 8$_1$, 8$_2$, ohmic contacts are formed at the interfaces between ferroelectric layer 4 and the electrodes 9$_1$, 9$_2$. Therefor no internal electric fields develop in the ferroelectric layers. As a result thereof the dielectric constant, at zero external biasing, and the tunability of the varactor can both be kept high. These buffer layers are however not necessary for the functioning of the present invention but merely relate to an advantageous implementation. The electrodes furthermore does not have to be gold electrodes but any other appropriate material can be used such as for example Cu, Ag or similar. Furthermore it is possible to use superconducting electrodes or even more particularly high temperature superconducting electrodes, e.g. of YBCO (Y—Ba—Cu—O). Additionally, instead of Mg, Ti or similar metals can be used for the buffer layers to make ohmic contacts.

Figure 4:
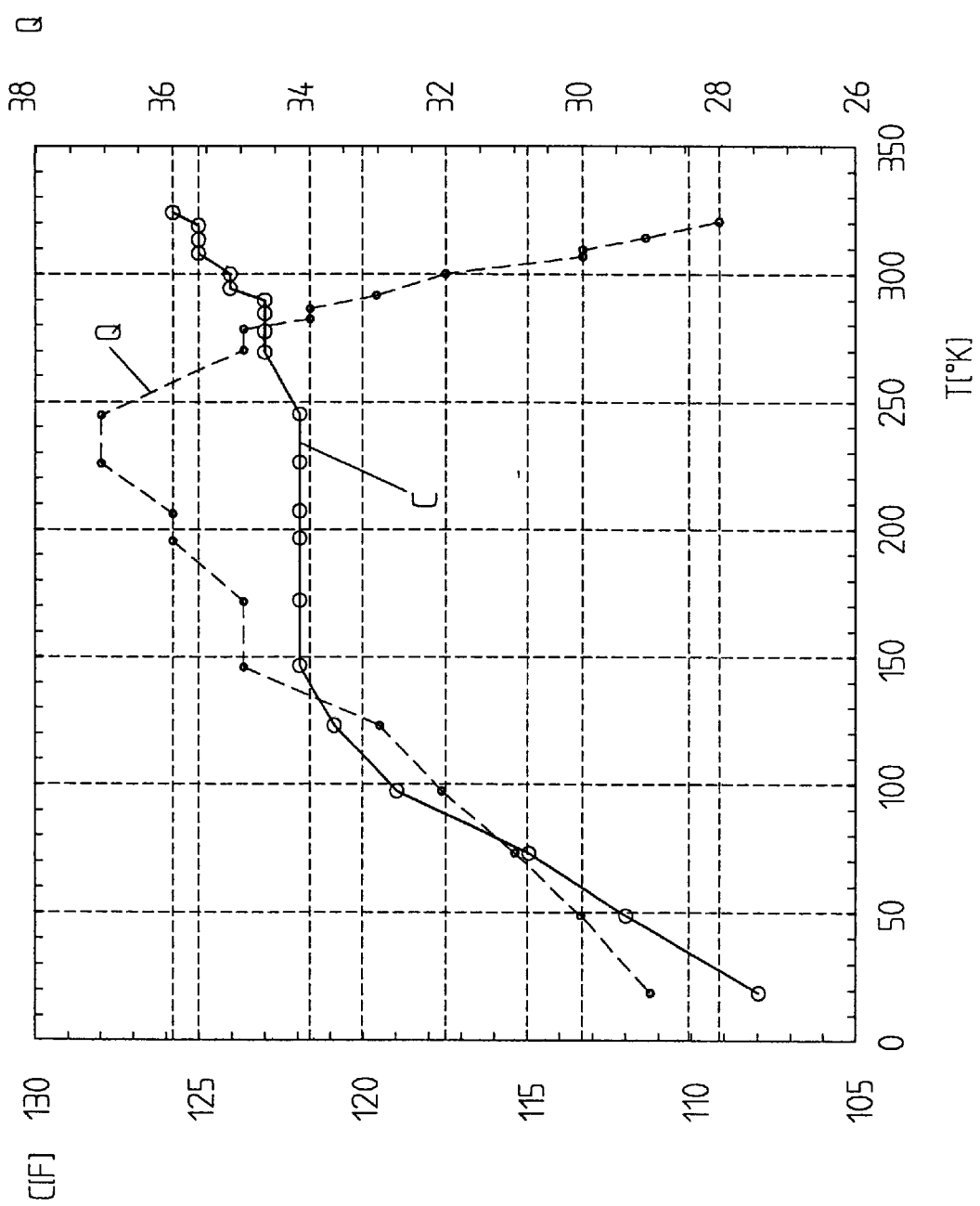
FIG. 4 is a plot illustrating the experimental verification of the temperature dependence of the capacitance C and the quality factor Q for an inventive varactor.

The microwave losses are minimal in the range wherein TCC is small, or particularly about zero, and consequently the quality factor of the varactor will have a maximum value. This is due to the fact that the losses of the ferroelectric layers 2 and 4 are highest at the Curie temperatures T$_{CR1}$ and T$_{CR2}$ respectively and decrease further away from these temperatures, as can be seen from the experimental performance of a varactor device of the type as discussed in FIG. 2, c.f. FIG. 4. This FIG. 4 relates to particular experimental results using BSTO films as ferroelectric layers 2 and 4 respectively. In this particular implementation the ferroelectric layer 2 comprises BSTO with x1=0.75, i.e. $Ba_{0.75}Sr_{0.25}TiO_3$ with a thickness of 0.4 μm. The ferroelectric layer 4 comprises $Ba_{0.25}Sr_{0.75}TiO_3$ with a thickness of 0.4 mm.

The dielectric layer 3 comprises MgO and it has a thickness of about 0.1 μm. The substrate layer 1 comprises MgO and it has a thickness of 0.5 mm. The buffer layers $8_1$, $8_2$ comprise Mg with a thickness of 0.1 μm. The electrodes $9_1$, $9_2$ comprises Au and have a thickness of 1.0 μm. The size of the electrodes $9_1$, $9_2$ is 0.125×0.125 mm whereas the width of the slot between the electrodes $9_1$, $9_2$ is 2,5 μm. In this implementation the films were epitaxially grown using laser ablation. The electrodes were produced by vacuum evaporation followed by photolithographic patterning.

It should be clear that this merely relates to one specific embodiment and the invention is of course not limited to epitaxial films being produced in any particular manner, as an example similar epitaxial films may also be produced by other appropriate technologies for epitaxial growth, such as sputtering, chemical vapor deposition, etc. as should be known to the man skilled in the art. In multilayer structures all intermediate buffer layers may consists of the same material, but different the buffer layers of a varactor device may also consist of different materials.

As an alternative to an intermediate buffer layer comprising MgO, c.f. layer 3 of FIG. 2, or a material of a similar type, also other (crystal matched) materials may be used. One example is $WO_3$. This is an oxide with the properties of attracting oxygen and enriching ferroelectric layers by oxygen. The fabrication of ferroelectric layers or films with a desired content of oxygen is difficult. Usually there is a lack of oxygen in ferroelectric films which negatively affects the dielectric properties of a ferroelectric crystal. Thus, through the application of $WO_3$ instead of for example MgO, the dielectric properties will be even further improved. This is of course applicable to any embodiment encompassed by the present application.

Figure 5:
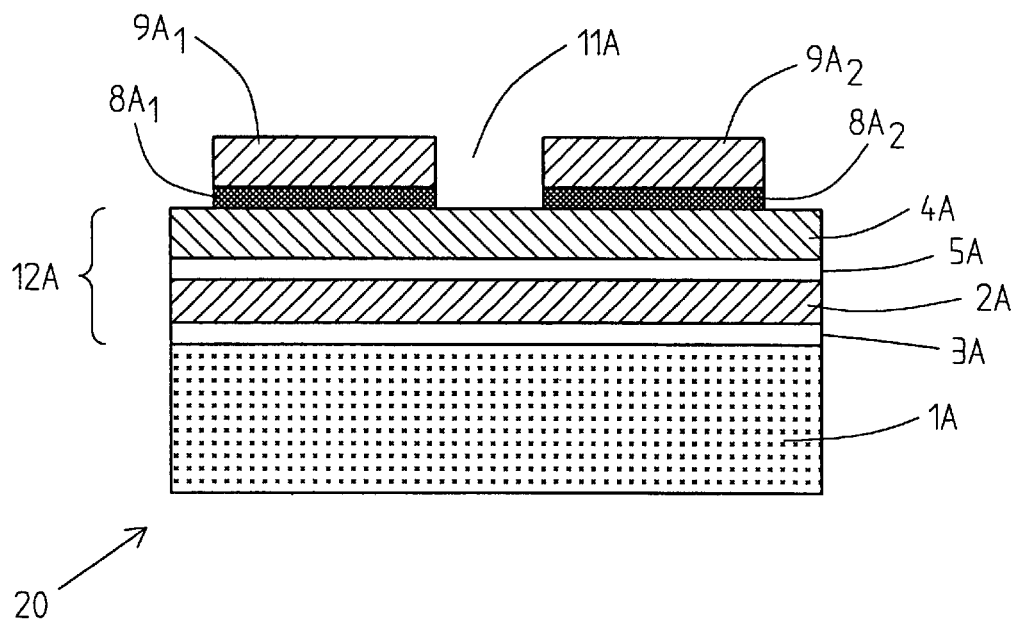
FIG. 5 is a view in cross-section of a varactor device according to a second embodiment of the present invention similar to that of FIG. 2 but wherein a further intermediate buffer layer is provided between the substrate layer and a ferroelectric layer.

FIG. 5 shows another varactor device 20 according to the invention which comprises a substrate layer 1A and a ferroelectric structure 12A provided on the substrate layer 1A. The ferroelectric structure 12A comprises a first ferroelectric layer 2A and a second ferroelectric layer 4A between which an intermediate buffer layer 5A is provided. In addition thereto it comprises a further intermediate buffer layer 3A which is provided adjacent the substrate layer 1A, i.e. between the substrate layer 1A and the first ferroelectric layer 2A. As in the embodiment described with reference to FIG. 2 buffer layers $8A_1$, $8A_2$ are provided between the top ferroelectric layer 4A and the longitudinal electrodes $9A_1$, $9A_2$, between which electrodes a gap 11A is defined. The materials used in this embodiment can be any of the materials discussed earlier in this application, in general terms $ABCO_3$, the intermediate buffer layers may also be of any kind as discussed above, e.g. dielectric layers for example of MgO or $WO_3$ or any combination thereof.

In a particular implementation the dielectric layers 3A, 5A consist of different materials. In one implementation one of the layers comprises for example MgO or a material with similar properties, whereas the other comprises $WO_3$. In addition to the properties discussed above the intermediate buffer layers, e.g. the dielectric layers, may be used to control the strain (compressive or stretching) in the ferroelectric layers depending on which their lattice constants are in relation to the lattice constant of the interfacing ferroelectric layers. If for example the ferroelectric layer needs to be compressed the lattice constant of the dielectric layer should be smaller than the lattice constant of the ferroelectric while still observing crystal matching and vice versa if the ferroelectric layer needs to be stretched.

Figure 6:
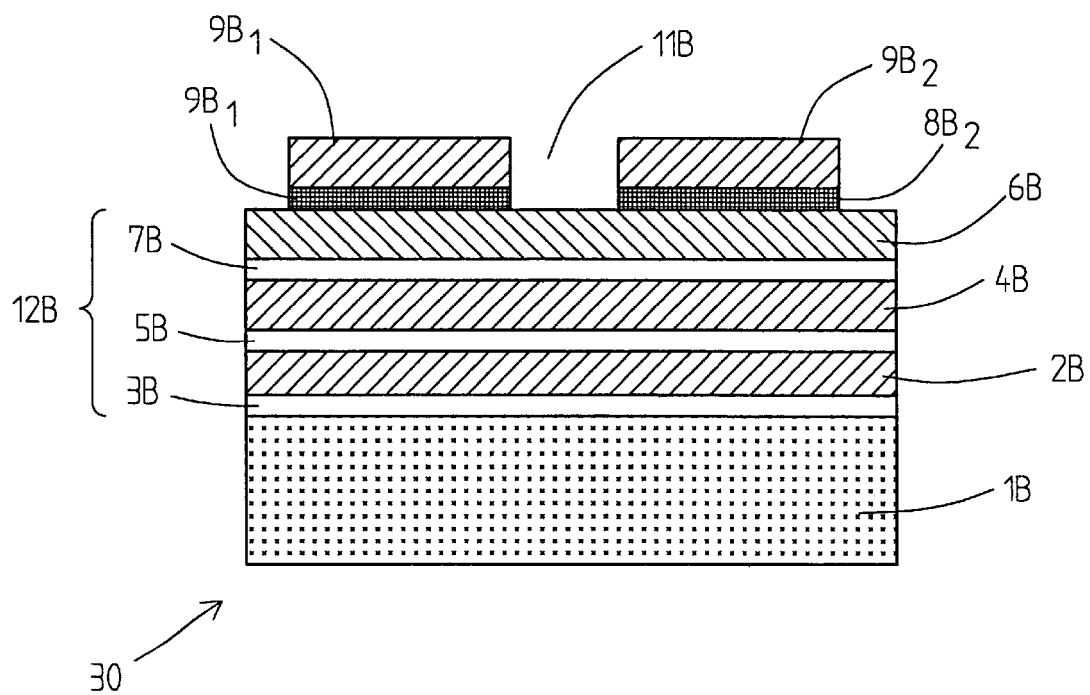
FIG. 6 is a cross-sectional view of a varactor device according to a third embodiment of the present invention comprising three ferroelectric layers and three dielectric layers wherein one of the dielectric layers has a chemical composition different from that of the two others.

In FIG. 6 still another embodiment of a varactor device 30 according to the invention is disclosed. As in the preceding embodiment it comprises a substrate layer 1B on which a ferroelectric layer structure 12B is provided. On top of the ferroelectric layer structure 12B electrodes $9B_1$, $9B_2$ are provided and there is a gap 11B between them. Preferably thin buffer layers $8B_1$, $8B_2$ are provided between the electrodes and the adjacent ferroelectric layer of the ferroelectric structure 12B. In this embodiment the ferroelectric structure 12B comprises three ferroelectric layers 2B, 4B, 6B and three intermediate buffer layers 3B, 5B, 7B which preferably are dielectric. The dielectric layers and the ferroelectric layers are arranged in an alternating manner. In an alternative embodiment (not shown) there is no intermediate buffer layer disposed between the substrate layer and the subsequent ferroelectric layer. Preferably the three ferroelectric layers 2B, 4B, 6B have different xi-values. Alternatively two ferroelectric layers have different xi-values whereas the third ferroelectric layer has the same xi-value as one of the other ferroelectric layers. Then however, the intermediate ferroelectric layer 4B has to be different from the ferroelectric layers 2B, 6B.

In the varactor device 30 the dielectric layer 5B may for example be chemically different from ferroelectric layers 3B, 7B which for example comprise MgO to take care of for example the strain if layers 3B, 7B are used to attract oxygen only and for example comprise $WO_3$ or a material with similar properties. Of course also the dielectric layers 3B, 5B, 7B may be the similar. Alternatively all three of them may be different.

Figure 7:
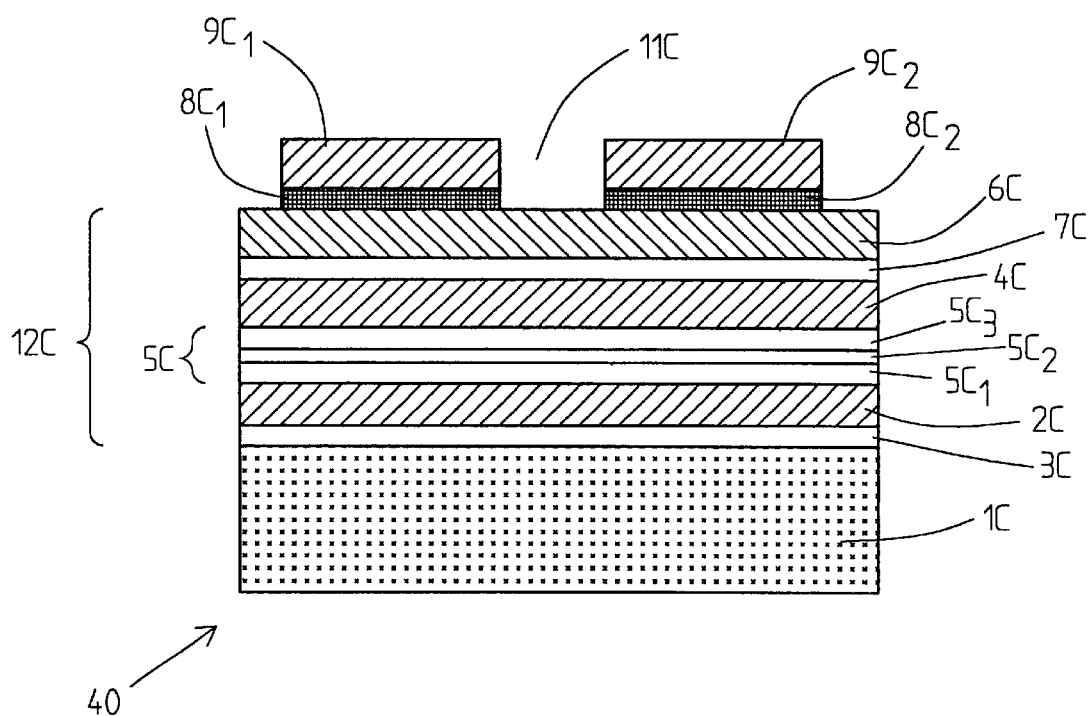
FIG. 7 is a cross-sectional view of a fourth embodiment of a varactor device according to the invention in which one of the intermediate buffer layers comprises a multilayer structure.

FIG. 7 shows still another implementation of a varactor device 40 according to the invention. Adjacent to substrate layer 1C a ferroelectric structure 12C is arranged on which electrodes $9C_1$, $9C_2$ are longitudinally disposed so as to define a longitudinal gap 11C between them. Between the electrodes $9C_1$, $9C_2$ thin buffer layers $8C_1$, $8C_2$ are provided, which however not are necessary for the functioning of present invention. The ferroelectric structure 12C comprises three ferroelectric layers 2C, 4C, 6C similar to the embodiment of FIG. 6. Between the bottom ferroelectric layer 2C and the substrate layer 1C a first intermediate buffer layer 3C is disposed. Between the first 2C and the second 4C ferroelectric layers a second intermediate buffer layer 5C is disposed which in this embodiment consists of three sublayers $5C_1$, $5C_2$, $5C_3$, i.e. the intermediate buffer layer 5C comprises a combination of (different) dielectric sublayers to take care of strain (lattice match) and oxygen enrichment at the same time. The intermediate buffer layer SC may for example comprise an MgO sublayer sandwiched between two $WO_3$ layers $5C_3$, $5C_1$. Between the second ferroelectric layer 4C and the third ferroelectric layer 6C another intermediate buffer layer 7C is provided. It here comprises one single layer.

In an alternative embodiment intermediate buffer layers comprising a number of sublayers, like intermediate buffer layer 5C may be used between all ferroelectric layers and/or between the substrate layer and the subsequent ferroelectric layer etc. Any combination is in principle possible. It may for example also comprise more than three sublayers etc.

It should be clear that a varactor device according to the present invention can take many forms and it may be varied in a number of ways within the scope of the present invention. It is not restricted to any particular number of layers included in the ferroelectric structure, different materials can be used in different combinations and also the substrate layer and the electrode structure can be varied in a number of ways, the main thing being that there is provided a ferroelectric layer structure containing alternatingly disposed ferroelectric and (dielectric) intermediate buffer layers to "chemically"isolate subsequent ferroelectric layers having different Curie temperatures from each other.

Figure 8A:
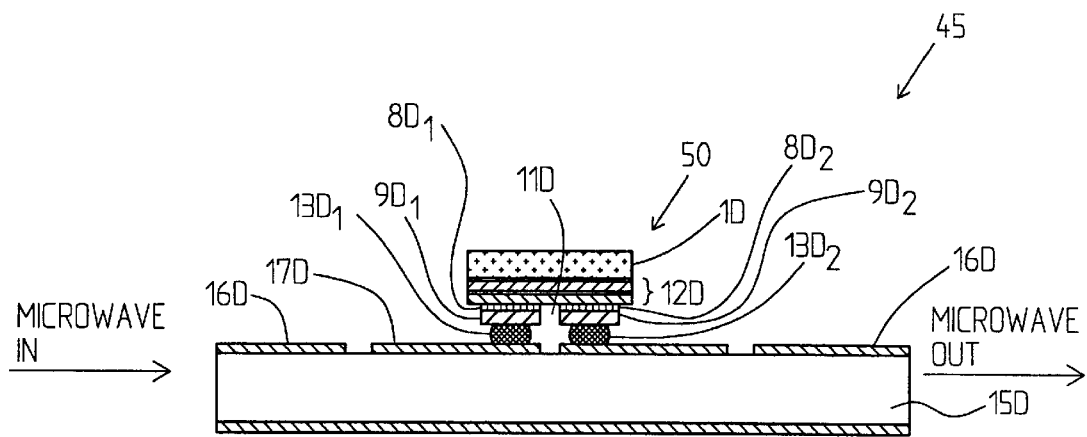
FIG. 8A is a cross-sectional view of one-pole tunable bandpass filter with a flip-chip connected varactor according to the invention.
Figure 8B:
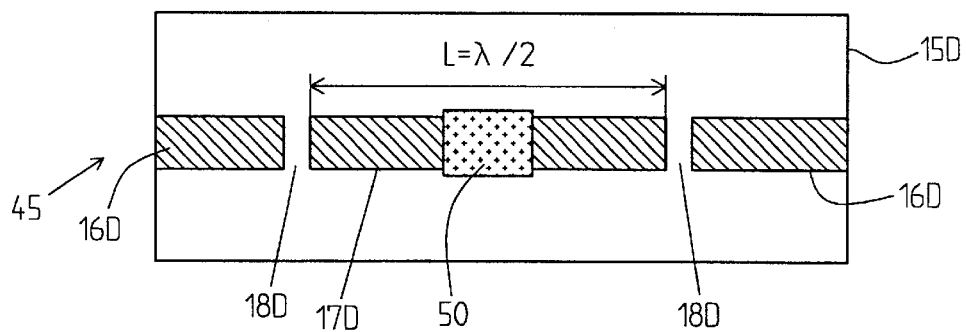
FIG. 8B is a top view of the filter of FIG. 8A, and FIG. 9 schematically illustrates a one-pole tunable bandpass filter application with a bond-wire connected varactor according to the present invention.
Figure 9:
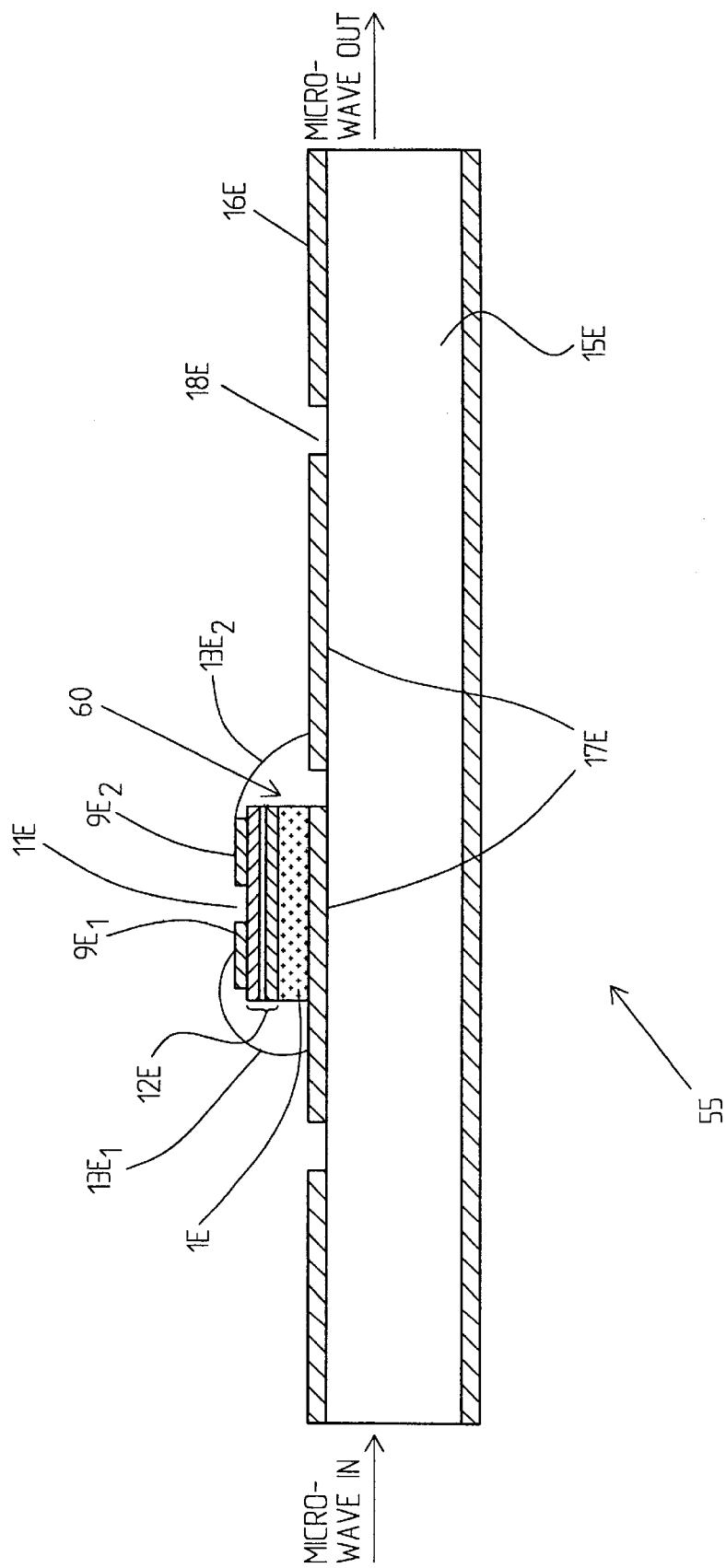

FIGS. 8A, 8B and FIG. 9 respectively schematically illustrate two practical implementations. FIG. 8A is a cross sectional view of a one-pole (one resonator) tunable bandpass filter 45 wherein a microstrip line 16D is disposed on a substrate 15D such that coupling gaps 18D are provided. On top of a half wavelength resonator 17D a varactor device 50 according to the present invention is connected by a so called flip-chip connection comprising "bumps" $13D_1$, $13D_2$ connected to the electrodes $9D_1$, $9D_2$ of the varactor device 50 which, like in the preceding embodiments, comprises a substrate layer structure 1D, a ferroelectric layer structure 12D and longitudinally disposed electrodes $9D_1$, $9D_2$ between which and the ferroelectric layer structure 12D, also in this embodiment, thin buffer layer $8D_1$, $8D_2$ are provided. In this embodiment the ferroelectric layer structure 12D comprises two ferroelectric layers and two intermediate dielectric buffer layers. It should be clear that any varactor device covered by the scope of the present invention could be connected by a flip-chip connection.

FIG. 8B is a top view of the bandpass filter of FIG. 8A and it can be seen how the varactor 50 is connected to a half wavelength, L=λ/2 resonator provided on substrate 15D. When a DC biasing circuit (not illustrated for reasons of simplicity) is connected to the varactor device, in other words when a DC bias is applied to the varactor, the capacitance of the varactor is changed and hence the total capacitance of the resonator is changed as well as its resonant frequency.

FIG. 9 shows an alternative embodiment of a one-pole (one resonator) tunable bandpass filter 55 with a varactor device 60 connected to it using bonding wires $13E_1$, $13E_2$. On a substrate 15E a microstrip line 16E is provided such that coupling gaps 18E are formed. The varactor device 60 is via bonding wires $13E_1$, $13E_2$ is connected to electrodes $9E_1$, $9E_2$ connected to the respective resonator plates. The varactor device 60 not illustrated in detail as any of the varactor devices discussed earlier can be used or any other varactor device falling within the scope of the present invention. The microwave input and output respectively are illustrated and also in this case the DC biasing circuit is not shown for reasons of simplicity. A DC bias applied to the varactor 60 changes its capacitance and hence the total capacitance of the resonator 17E as well as its resonant frequency.

It should be clear that the varactor device can be used for many other applications in different kinds of microwave transmission line applications, filters, resonators, slot transmission lines, and generally in microwave and millimeter wave circuits, such as phase shifters, delay lines, mixers, harmonic generators etc.

It should also be clear that the electrode structure is not limited to two longitudinally disposed electrodes but they can in principle have any form and be provided in any desired number. Even if for most of the illustrated devices the electrodes are on the top and the substrate at the bottom, the inventive concept is not limited thereto.

Also in other aspects the invention is not limited to the specifically illustrated embodiments but it can be varied in a number of ways within the scope of the appended claims.

What is claimed is:

1. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein all layers have lattice matched crystal structures.

2. The varactor device according to claim 1, wherein at least the first and second ferroelectric layers are chemically isolated from each other by an intermediate buffer layer and the chemical elemental composition of the ferroelectric layers differ in that at least one element is different.

3. The varactor device according to claim 1, wherein the layers of the ferroelectric layer structure comprise single crystalline epitaxial films.

4. The varactor device according to claim 1, wherein the substrate layer has an elemental composition of one of MgO and $LaAlO_3$ and the electrode structure comprises longitudinally arranged electrodes defining a gap between them.

5. The varactor device according to claim 1, wherein the ferroelectric layers have a thickness less than or equal to about 1 μm, and in that the intermediate buffer layers have a thickness less than or equal to about 100 nm.

6. The varactor device according to claim 1, wherein the ferroelectric layer structure comprises a ferroelectric nano-structure with ultra-thin ferroelectric layers having a thickness less than or equal to about 100 nm.

7. The varactor device according to claim 1, wherein a buffer layer is provided adjacent to the electrode structure.

8. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein the ferroelectric layers comprise ceramic materials, and wherein the ceramic material(s) comprise perovskite oxides of the formula $R_xR'_{1-x}R''O_3$, wherein R and R' are independently selected from a group of elements consisting of Group I and Group II metals of the Periodic Table of Elements and R'' is selected from a group of elements consisting of Group IV and Group V metals of the Periodic Table of Elements, wherein each ferroelectric layer has an elemental composition of $Ba_{xi}Sr_{1-xi}TiO_3$ respectively, wherein the content x[] is different for at least two ferroelectric layers to produce different Curie temperatures for said at least two ferroelectric layers.

9. The varactor device according to claim 8, wherein for at least two ferroelectric layers denoted i and i+1, the content $x_i$ is in the range $0 \leq x_i \leq 1$, and content $x_{(i+1)}$ is in the range $0 \leq x(x+1) \leq 1$.

10. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein the ferroelectric layers comprise ceramic materials, and wherein the ceramic material(s) comprise perovskite oxides of the formula $R_xR'_{1-x}R''O_3$, wherein R and R' are independently selected from a group of elements consisting of Group I and Group II metals of the Periodic Table of Elements and R" is selected from a group of elements consisting of Group IV and Group V metals of the Periodic Table of Elements, wherein the ferroelectric layers comprise $Na_{xi}K_{1-xi}NbO_3$ respectively, wherein the content $x_i$ is different for at least two ferroelectric layers to produce different Curie temperatures.

11. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein the intermediate buffer layers comprise dielectric films, and wherein at least one of the dielectric film layers has an elemental composition of one of MgO, $LaAlO_3$, and $CeO_2$.

12. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein the intermediate buffer layers comprise dielectric films, and wherein at least one of the dielectric film layers has an elemental composition of $WO_3$.

13. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein at least one of the intermediate buffer layers comprises a multilayer structure comprising a number of sublayers wherein at least one sublayer has an elemental composition of MgO and at least one sublayer has an elemental composition of $WO_3$.

14. A thin film ferroelectric varactor device comprising a substrate layer, a ferroelectric layer structure, and an electrode structure, wherein the ferroelectric layer structure includes a number of ferroelectric layers and a number of intermediate buffer layers arranged in an alternating manner, and at least a first and a second of the ferroelectric layers have different Curie temperatures, whereby the dielectric constant of the first ferroelectric layer has a maximum at a temperature which is different than the temperature at which the dielectric constant of the second ferroelectric layer has a maximum, wherein the ferroelectric layer structure comprises at least three ferroelectric layers.

15. The varactor device according to claim 10, wherein the temperature dependence of the varactor is determined by at least one of a selection of Curie temperatures and values of $x_i$ and $1-x_i$ of an element of the composition of the respective ferroelectric layers.

16. A thin film ferroelectric varactor device comprising a substrate layer, a ferroelectric layer structure, and an electrode structure, wherein the ferroelectric layer structure comprises a number of ferroelectric layers and a number of intermediate buffer layers that form dielectric layers, the ferroelectric layers and the dielectric layers being arranged in an alternating manner such that ferroelectric layers between which an intermediate buffer layer is provided are chemically separated from each other and have a different elemental composition such that the temperature dependence of the dielectric constants of the respective layers is different, wherein the ferroelectric layers comprise ceramic materials such as perovskite oxides of the type $R_xR'_{1-x}R''O_3$ wherein $x_i$ is different for at least subsequent ferroelectric layers between which an intermediate buffer layer is arranged, and wherein for each ferroelectric layer, i, $x_i$ is in the range $0 \leq x_i \leq 1$, wherein i=1, . . . , N, with N being the number of ferroelectric layers, and wherein the ferroelectric layers i, wherein i=1, . . . N, with N being the number of layers, are one of $Ba_{xi}Sr_{1-xi}TiO_3$ and $NA_{xi}K_{1-xi}NbO_3$.

17. The varactor device according to claim 16, wherein all layers of the varactor device have matching crystal structures and the Curie temperatures of the respective layers are different, wherein the Curie temperatures are controlled by the value of $x_i$, whereby the temperature dependence of the capacitance of the varactor can be controlled.

18. The varactor device according to claim 16, wherein the varactor device tunes at least one of tunable microwave (RE) circuits, tunable resonators, filters, phase shifters, delay lines, mixers, and harmonic generators.

* * * * *